(12) United States Patent
Ghaly et al.

(10) Patent No.: US 9,135,109 B2
(45) Date of Patent: Sep. 15, 2015

(54) DETERMINATION OF OPTIMUM THRESHOLD VOLTAGE TO READ DATA VALUES IN MEMORY CELLS

(71) Applicant: Seagate Technology LLC, Cupertino, CA (US)

(72) Inventors: Mai A. Ghaly, Bloomington, MN (US); Bruce Douglas Emo, Longmont, CO (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 132 days.

(21) Appl. No.: 13/794,716

(22) Filed: Mar. 11, 2013

(65) Prior Publication Data

US 2014/0258796 A1    Sep. 11, 2014

(51) Int. Cl.
| | |
|---|---|
| *G06F 11/00* | (2006.01) |
| *G06F 11/10* | (2006.01) |
| *G01R 31/317* | (2006.01) |
| *G11C 16/34* | (2006.01) |
| *G11C 7/14* | (2006.01) |
| *G11C 29/02* | (2006.01) |

(52) U.S. Cl.
CPC ........ *G06F 11/1008* (2013.01); *G01R 31/3171* (2013.01); *G06F 11/1048* (2013.01); *G11C 7/14* (2013.01); *G11C 16/3404* (2013.01); *G11C 29/021* (2013.01); *G11C 29/028* (2013.01)

(58) Field of Classification Search
CPC .... H04L 1/203; G01R 31/3171; G11C 16/34; G11C 16/3404; G06F 11/1008
USPC .................. 714/704, 708, 721, 746, 763, 773
See application file for complete search history.

(56) References Cited

U.S. PATENT DOCUMENTS

| | | | |
|---|---|---|---|
| 6,044,019 | A | 3/2000 | Cernea et al. |
| 6,522,580 | B2 | 2/2003 | Chen et al. |
| 7,023,735 | B2 | 4/2006 | Ban et al. |
| 7,372,731 | B2 | 5/2008 | Ban |
| 7,535,765 | B2 | 5/2009 | Maayan |
| 7,558,109 | B2 | 7/2009 | Brandman et al. |
| 7,593,259 | B2 | 9/2009 | Kim |
| 7,663,914 | B2 | 2/2010 | Lee |
| 7,890,818 | B2 | 2/2011 | Kong et al. |
| 7,903,468 | B2 | 3/2011 | Litsyn et al. |
| 7,944,757 | B2 | 5/2011 | Moschiano et al. |

(Continued)

FOREIGN PATENT DOCUMENTS

| | | |
|---|---|---|
| WO | WO2008078314 | 7/2008 |
| WO | WO2011008367 | 1/2011 |
| WO | WO2011094454 | 8/2011 |

OTHER PUBLICATIONS

Peleato et al., Towards minimizing read time for NAND flash, 2012, IEEE, p. 1 to 6.*

(Continued)

*Primary Examiner* — Shelly A Chase
(74) *Attorney, Agent, or Firm* — Hollingsworth Davis, LLC (57) ABSTRACT

An adaptive search scheme leads to threshold voltages that have lower bit error rates over initial values. An initial reference voltage is used and data is measured for set steps in voltage about the initial value sufficient to fit a polynomial curve. A minimum is used to determine the lowest bit error rate and corresponding optimum threshold voltage. This voltage is adopted as the new threshold voltage for reading the given data.

20 Claims, 7 Drawing Sheets

(56) References Cited

U.S. PATENT DOCUMENTS

| | | |
|---|---|---|
| 7,945,825 B2 | 5/2011 | Cohen et al. |
| 7,974,132 B2 | 7/2011 | Cornwell et al. |
| 7,990,764 B2 | 8/2011 | Alrod et al. |
| 8,000,135 B1 | 8/2011 | Perlmutter et al. |
| 8,000,141 B1 | 8/2011 | Shalvi et al. |
| 8,068,361 B2 | 11/2011 | Kang et al. |
| 8,077,520 B1 | 12/2011 | Yang et al. |
| 8,289,781 B2 | 10/2012 | Litsyn et al. |
| 8,331,169 B1 | 12/2012 | Yang et al. |
| 8,345,477 B1 | 1/2013 | Yang |
| 8,351,258 B1 | 1/2013 | Yang et al. |
| 8,363,501 B1 | 1/2013 | Ramamoorthy et al. |
| 8,369,141 B2 | 2/2013 | Sommer et al. |
| 8,386,890 B2 | 2/2013 | Wezelenburg et al. |
| 8,498,152 B2 | 7/2013 | Alrod et al. |
| 8,531,888 B2 | 9/2013 | Chilappagari et al. |
| 2005/0013165 A1 | 1/2005 | Ban et al. |
| 2006/0028875 A1 | 2/2006 | Avraham et al. |
| 2009/0287975 A1 | 11/2009 | Kim et al. |
| 2010/0091535 A1 | 4/2010 | Sommer et al. |
| 2010/0118608 A1 | 5/2010 | Song et al. |
| 2010/0191931 A1 | 7/2010 | Kim |
| 2010/0199149 A1 | 8/2010 | Weingarten et al. |
| 2011/0038212 A1 | 2/2011 | Uchikawa et al. |
| 2011/0066902 A1 | 3/2011 | Sharon et al. |
| 2011/0069521 A1 | 3/2011 | Elfadel et al. |
| 2011/0141827 A1 | 6/2011 | Mozak et al. |
| 2011/0182118 A1 | 7/2011 | Litsyn et al. |
| 2011/0216598 A1 | 9/2011 | Kim et al. |
| 2014/0068365 A1* | 3/2014 | Chen et al. ............... 714/746 |

OTHER PUBLICATIONS

Kong et al., Cell-to-cell interference compensation schemes using reduced symbol pattern of interfering cells for MLC NAND flash memory, 2012, IEEE< p. 1 to 5.*

Dong et al., Techniques for embracing intra-cell unbalanced bit error characteristics in MLC NAND flash memory, 2010, IEEE, p. 1915-1920.*

Apr. 25, 2014, File History for U.S. Appl. No. 13/275,497.
Apr. 25, 2014, File History for U.S. Appl. No. 13/275,675.
U.S. Appl. No. 13/275,418, filed Oct. 18, 2011, Patapoutian et al.
U.S. Appl. No. 13/275,497, filed Oct. 18, 2011, Sridharan et al.
U.S. Appl. No. 13/275,598, filed Oct. 18, 2011, Sridharan et al.
U.S. Appl. No. 13/275,675, filed Oct. 18, 2011, Sridharan et al.
Mielke et al., "Bit Error Rate in NAND Flash Memories", 46$^{th}$ Annual International Reliability Physics Symposium, Phoenix, 2008, pp. 9-19.
Yaakobi et al., "Error Characterization and Coding Schemes for Flash Memories", GLOBECOM Workshops, 2010, IEEE, 5 pages.
Nov. 1, 2013, File History for U.S. Appl. No. 13/275,497.
Nov. 12, 2013, File History for U.S. Appl. No. 13/275,598.
Nov. 12, 2013, File History for U.S. Appl. No. 13/275,418.
Nov. 12, 2013, File History for U.S. Appl. No. 13/275,675.

* cited by examiner

DETERMINATION OF OPTIMUM THRESHOLD VOLTAGE TO READ DATA VALUES IN MEMORY CELLS

SUMMARY

Various embodiments describe in this disclosure are generally directed to methods controllers and devices for determining optimum threshold voltages used to read data values in memory cells of a solid-state, non-volatile memory.

Some embodiments involve methods of operating a memory device. Respective bit error rates affecting memory cells of a solid-state, non-volatile memory are determined for shifted threshold voltages used to read the data values in the memory cells. The shifted threshold voltages include an initial threshold voltage shifted by each of at least three voltage steps. A polynomial fit is applied to the respective bit error rates as a function of the at least three voltage steps. An optimal bit error rate having an associated optimal threshold voltage is determined in response to the polynomial fit. The optimal threshold voltage is applied to read the data values in the cells.

Some embodiments involve a controller that comprises a memory interface, a decoder, and a voltage analyzer. The memory interface is configured to receive data from a solid-state, non-volatile memory, the data read using threshold voltage shifted by each of at least three voltage steps. The decoder is configured to decode the received data and to determine respective bit error rates of cells of the memory for each of the shifted threshold voltages. The voltage threshold analyzer is configured to do at least three tasks. First, it applies a polynomial fit to the respective bit error rates as a function of the shifted threshold voltages. Second, it determines an optimal bit error rate having an associated optimal threshold voltage in response to the polynomial fit. Third, it sends the optimal threshold voltage for use in reading the data to the memory via the memory interface.

Some embodiments involve a device comprising a solid-state, non-volatile memory, read circuitry, a decoder, and a voltage threshold analyzer. The solid-state, non-volatile memory comprises an array of memory cells. The read circuitry is configured to read data from the memory cells using threshold voltages, including reading data using shifted threshold voltages comprising an initial threshold voltage shifted by each of at least three voltage steps. The decoder is configured to decode the data and to determine respective bit error rates of the memory cells for each of the shifted threshold voltages. The voltage threshold analyzer is configured to do at least three tasks. First, a polynomial fit is applied to the respective bit error rates as a function of the shifted threshold voltages. Second, an optimal bit error rate having an associated optimal threshold voltage is determined in response to the polynomial fit. Third, the optimal threshold voltage is sent to the read circuitry, wherein the read circuitry is configured to read data from the memory cells using the optimal threshold voltage.

DETAILED DESCRIPTION

Non-volatile memory devices are capable of retaining stored data for relatively long periods of time, even to the absence of external power. Non-volatile, solid-state memory include flash memory that programs data into memory cells by applying a voltage causing a charge to be stored on a floating gate of a transistor. The data can be read later from the memory cell by sensing the voltage of the transistor and comparing the sensed voltage to a read reference voltage. Flash memory technologies include NOR flash, NAND flash, 2D NAND flash, 3D NAND flash (also called NAND (VNAND)), and various other technologies known to the industry.

Memory cells are known to exhibit errors caused, for example, by charge leakage, manufacturing defects, and disturb effects. These errors may be manifested as bit errors in the decoded data. A memory device may use a number of measures to account for these errors, such as error correction codes (ECC) that utilize extra data for detecting and correcting bit errors. The memory device may generate a bit error rate (BER) signal based on ECC activity and can use BER to analyze system performance.

Non-volatile memory devices may include single level cells (SLCs) that store one bit of data per cell or may include multi-level cells (MLCs) that can be programmed to store two or more bits of information. Reading data stored in SLCs involves distinguishing between two possible voltage levels. Reading data stored in MLCs involves distinguishing between more than two possible voltage levels. In general, a memory cell may be programmed to a predetermined number of threshold voltage ($V_T$) values.

The memory cells of a memory device can be grouped into data units referred to herein as data pages or blocks. A data page can correspond, for example, to a group of memory cells that are read at substantially the same time. A group of memory pages that are erased at substantially the same time may be referred to as a block or erasure unit. Memory cells are programmed in units of pages and the pages are not re-programmed, once programmed, until after the block of pages is erased. Garbage collection operations can be performed on the blocks of pages, wherein the blocks are erased after active data stored in each block is moved to another location. Thus, each memory cell of the memory device undergoes numerous program/erase (PE) cycles during the lifetime of the memory cell. In floating gate transistor memory cells, each PE cycle can degrade the cell, and after many PE cycles, lead to a decreased ability of the cell to retain data without substantial charge leakage.

The errors in reading the data may be decreased by modifying the threshold voltage ($V_T$) also known as the read reference voltage used to read data stored in the memory cells. Charge retention through such means as, for example, leakage causes $V_T$ to shift to the negative voltage shift (−ve) direction while disturb effects forces it to shift to the positive voltage shift (+ve) direction. Thus, as search scheme must be developed to address the uncertainty in the attainment of optimum $V_T$ values during error recovery and actual drive operation. The current disclosure concerns an adaptive $V_T$ search scheme that not only finds the optimum $V_T$ value but also minimizes the search time to reduce the impact on Input/Output (IO) performance.

Embodiments described in this disclosure involve methods, controllers, and devices for determining whether a $V_T$ results in the lowest BER or needs to be changed to a more optimum $V_T$ with an even lower BER. In various implementations, a procedure is advanced for determining whether a new optimum threshold voltage exists that is then used in place of the initial threshold voltage in each memory cell that is analyzed.

Figure 1A:
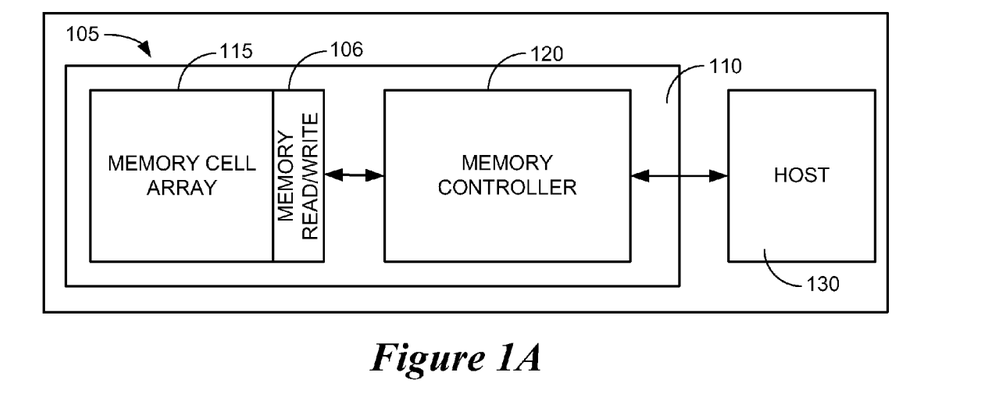
FIG. 1A is a block diagram of a system capable of storing data in memory cells and later retrieving the data stored including adjusting one or more threshold voltages for reading data in memory cells to achieve minimum bit error rates.

FIG. 1A is a block diagram of a system 100 capable of storing data in memory cells and later retrieving the data stored including adjusting one or more $V_T$ values for reading data in memory cells to achieve minimum BERs. The system 100 includes a memory element 105 that may be coupled for communication with a host processor 130. The memory element 105 comprises a memory cell array 115 and a memory controller that is in communication with the host 130. The memory cell array 115 comprises a memory read/write element 106. The block diagram of FIG. 1A and other block diagrams discussed herein show system components divided into functional blocks. It will be appreciated by those skilled in the art that there exist many possible configurations in which these functional blocks can be arranged and implemented. The examples depicted herein provide some possible functional arrangements for system components. Alternatively, some implementations may encompass all or a portion of the functionality of the memory controller 120 included within the host 130. Other implementations may encompass the read/write element 106 included with the functions of the controller 120. In still another example, the various approaches described herein may be implemented using hardware, software, or a combination of hardware and software. Memory chips, controller chips and/or host computers may contain one or more of the functional elements discussed herein.

Figure 1B:
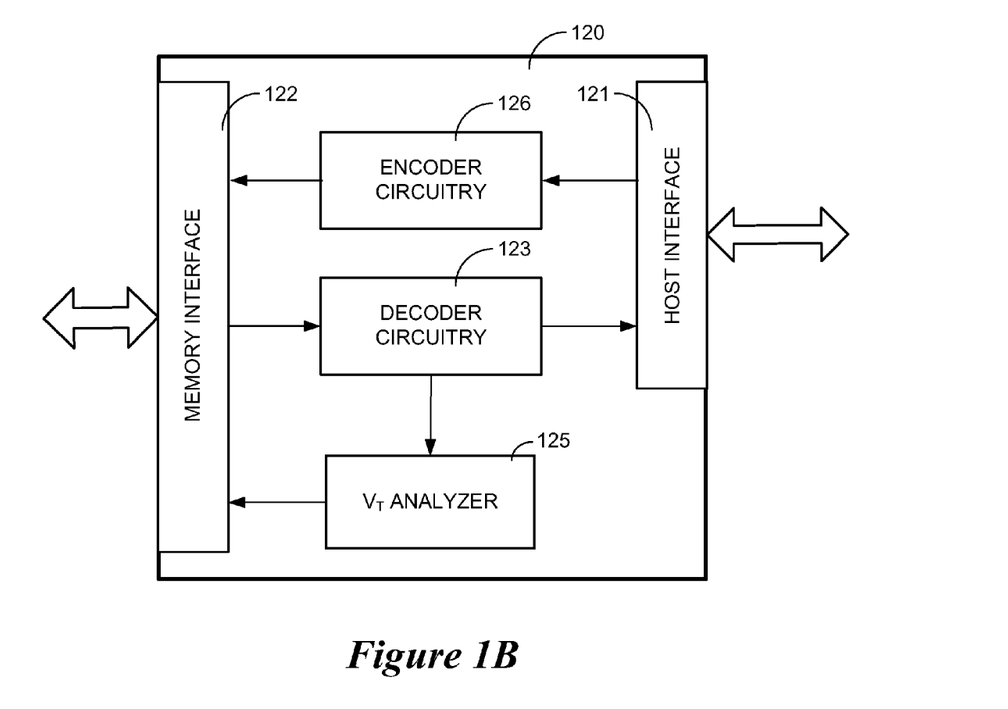
FIG. 1B provides a more detailed view of the memory controller of FIG. 1 including a threshold voltage analyzer in accordance with embodiments discussed herein.

FIG. 1B provides a more detailed view of the memory controller of FIG. 1 including a threshold voltage ($V_T$) analyzer in accordance with embodiments discussed herein. The memory controller 120 further comprises a host interface 121, a memory interface 122, encoder circuitry 126, decoder circuitry 123 and a $V_T$ analyzer 125. The memory interface 121 serves to permit the memory controller 120 to communicate with the memory cell array 115. The host interface 121 serves to permit communication between the host 130 and the memory controller 120. The host interface 121 passes data that is to be written into storage to the encoded circuitry 126 that encodes the data for transmission to the memory interface 122 through the memory read/write element 106 into storage in the memory array 115. The memory interface 122 then passes data that is to be read to the decoder circuitry 123 for eventual transmission through the host interface 121 to the host 130. While the data is in the decoder circuitry 123, it is passed in a loop to the $V_T$ analyzer 125, the memory interface 122, the memory array 105, the memory interface 122, the decoder circuitry 123, and back to the $V_T$ analyzer 125 in a iterative manner with slightly different $V_T$ values each time to find a $V_T$ having a lower BER than what was initially associated with initial $V_T$. Once a final $V_T$ is determined, then that VT is entered into the decoder circuitry 125 for transmission of the data through the host interface 122 to the host 130.

Figure 1C:
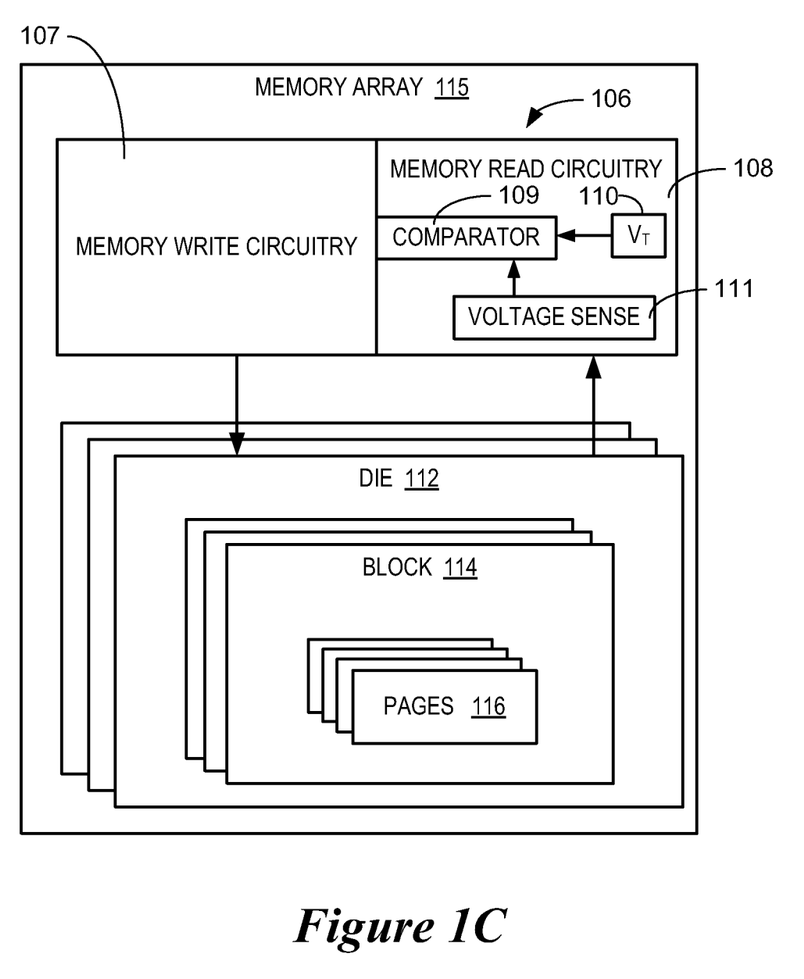
FIG. 1C provides a more detailed view of the memory cell array of FIG. 1 including memory reading circuitry for obtaining data used minimize bit error rates of threshold voltages.

FIG. 1C provides a more detailed view of the memory cell array 115 of FIG. 1 including memory reading circuitry for obtaining data used minimize bit error rates of threshold voltages. Memory array 115 comprises memory read circuitry 106, memory write circuitry 107, and a collection of memory cells arranged in pages 116 that are arranged in blocks that are arranged in dies 112. The memory write circuitry 107 transmits the data to the memory cells for storage to be read at a later time. The stored data to be read is transmitted from the memory cells to a memory read circuitry 108. While there the data is passed through a comparator 109 where different reads are done with different $V_T$ values 110, BER associated with each $V_T$ is determined 111, and the BERs are compared to determine the $V_T$ with the lowest BER.

Figure 2:
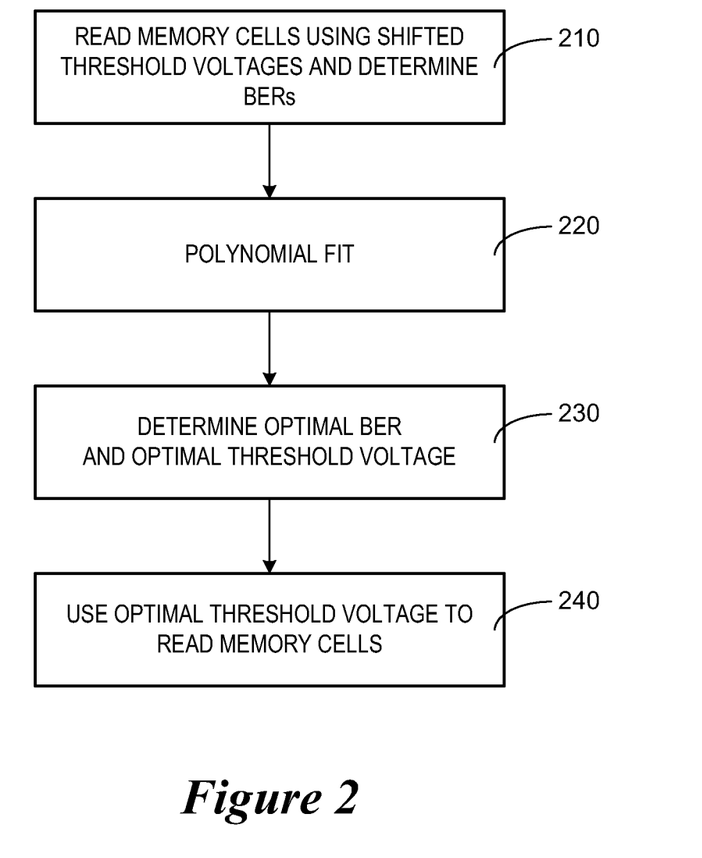
FIG. 2 illustrates a method of obtaining minimum threshold voltages in accordance with embodiments described herein.

The method embodiment for operating a memory device to determine an optimum $V_T$ comprises four steps. The first step is to determine respective BERs reported at the memory cells of a solid-state, non-volatile memory for shifted voltages, ($V_T$ values) used to read the data values in the memory cells, the shifted $V_T$ values comprising an initial $V_T$ shifted by each of at least three voltage steps. The second step is to apply a polynomial fit to the respective BERs as a function of the at least three voltage steps. The third step is to determine, in response to the polynomial fit, an optimal BER having an associated optimal $V_T$. The fourth step is to apply the optimal $V_T$ to read the data values in the cells. FIG. 2 illustrates the method of obtaining minimum $V_T$ values in accordance with embodiments described herein.

The size of the steps is often of a quantity chosen to adjust the initial $V_T$ in a manner that is likely to allow a new $V_T$ to be found with a lower BER when the cell has experienced either sufficient leakage or disturb effects to meaningfully increase the initial BER associated with the initial $V_T$. Typically, a small shift is first chosen to determine if a meaningfully lower BER can be obtained. However, larger shift quantities may be chosen if the earlier results are inconclusive.

In some embodiments, a larger shifted $V_T$ is measured after a minimum BER is detected that is lower than that of the BER associated with the initial $V_T$. This provides a measurement that permits a better fit of the data to a polynomial. The large shift also is used as a sanity check even if a new optimum $V_T$ was found to ensure that the actual minimum BER is a global minima and not a local one that can be ignored.

Figure 3A:
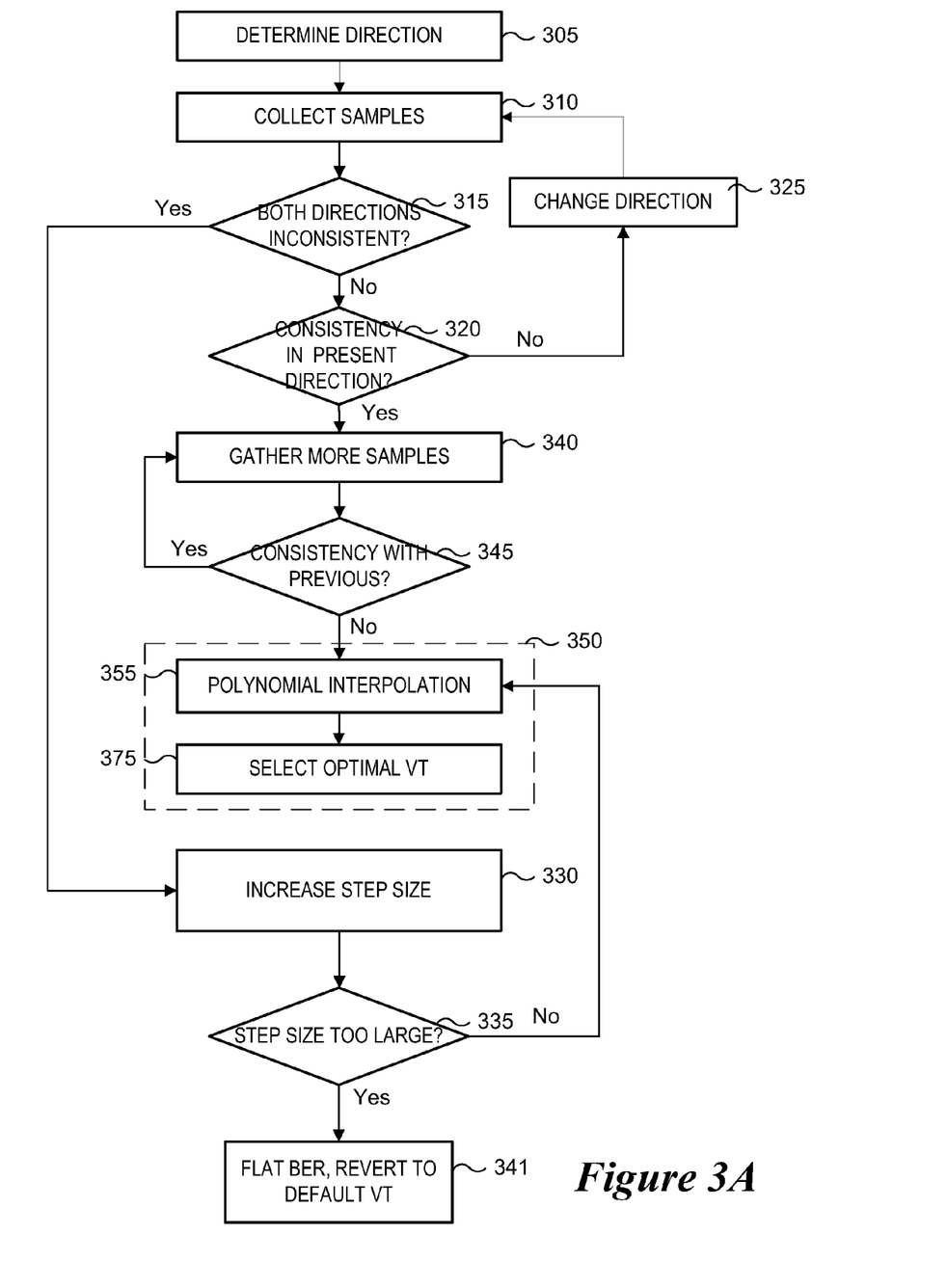
FIG. 3A shows a flow diagram describing an iterative process of determining a threshold voltage with a minimum bit error rate for reading data in accordance with example embodiments.

FIG. 3A shows a flow diagram describing an iterative process of determining a $V_T$ with a minimum BER for reading data in accordance with example embodiments. Initially, a direction is chosen for shifting the $V_T$. As stated earlier, positive shifts or steps are associated with BER increases due to disturb effects and negative shifts or steps are associated with BER increases due to voltage leakages. First, in step 305, a direction is chosen for the first shift in voltage from the initial $V_T$. Then, in step 310, at least two $V_T$ samples are chosen, the initial $V_T$ and the shifted $V_T$, data is read with each $V_T$ and a BER is associated with each. In step 315, a decision is made whether both directions are inconsistent. Inconsistent means that the BER value for the associated shifted $V_T$ is the same or higher than that for the initial $V_T$. Consistent means that the BER value for the associated shifted $V_T$ is the lower than that for the initial $V_T$. If only one direction has been tested, then one moves to decision step 320 to determine the consistency in that direction. If inconsistent, then the analysis goes to step 325 to change shift direction and back to step 310 to collect samples. If both directions have been tested, and they are both inconsistent, then the analysis proceeds to step 330 to increase the step size and go to decision step 335 to determine if the size of the shift or step is too large by some predetermined value. If so, then proceed to step 341, determine that the BER for the initial $V_T$ is lowest within a meaningful difference and make no change in $V_T$. This can mean that at least some of the BER values for the shifted $V_T$ values were the same as that associated with the BER for the initial $V_T$. It can also mean at least some of the BER values for the shifted $V_T$ values were the higher than that associated with the BER for the initial $V_T$. In this situation, the BER associated with the other shifted $V_T$ values may be lower but not in a meaningfully different amount. If the size of the shift is not too large, the process goes back to step 305 to begin a new cycle of analysis for the initial $V_T$.

If the consistency decision of step 320 is yes, then at least two more samples are gathered for $V_T$ values having one and two more steps in voltage in the direction being analyzed as shown in step 340. Then the analysis proceeds to step 345 where consistency is determined. Here consistency means that the BERs are still trending downward and inconsistency means that at least the BERs associated with a shifted $V_T$ that is furthest from the initial $V_T$ is either flat or higher than the BER for the shifted $V_T$ immediately preceding that value. If consistency is determined, the analysis goes back to step 340 to gather more samples. If inconsistency is determined, the analysis proceeds to the select optimal $V_T$ as shown generally in step 350. Briefly, this step involves a polynomial interpolation in step 355 to generate a polynomial that fits the data for the direction of interest. Then an optimal $V_T$ is determined from the polynomial as shown in step 375.

Several examples illustrate the above process. In one example, a $V_T$ with a +1ve shift and a $V_T$ with −1ve shift show no decrease in associated BER over the BER associated with the initial BER. This continues for increased sizes of shifts until a maximum level of shifting occurs. No change in initial $V_T$ is made. In another example, a $V_T$ with −1ve shows a decrease in BER over the BER associated with the initial $V_T$. The BERs for the first two additional shifted pairs of samples were consistently lower in associated BER over that of the immediately preceding shifted $V_T$. The third additional pair was inconsistent with the BER being flat and increasing for the −6ve and −7ve shifted $V_T$. A polynomial curve is fit to the data of BER vs. $V_T$, a minimum BER is determined, and an associated optimal $V_T$ is determined replacing the initial $V_T$.

Figure 3B:
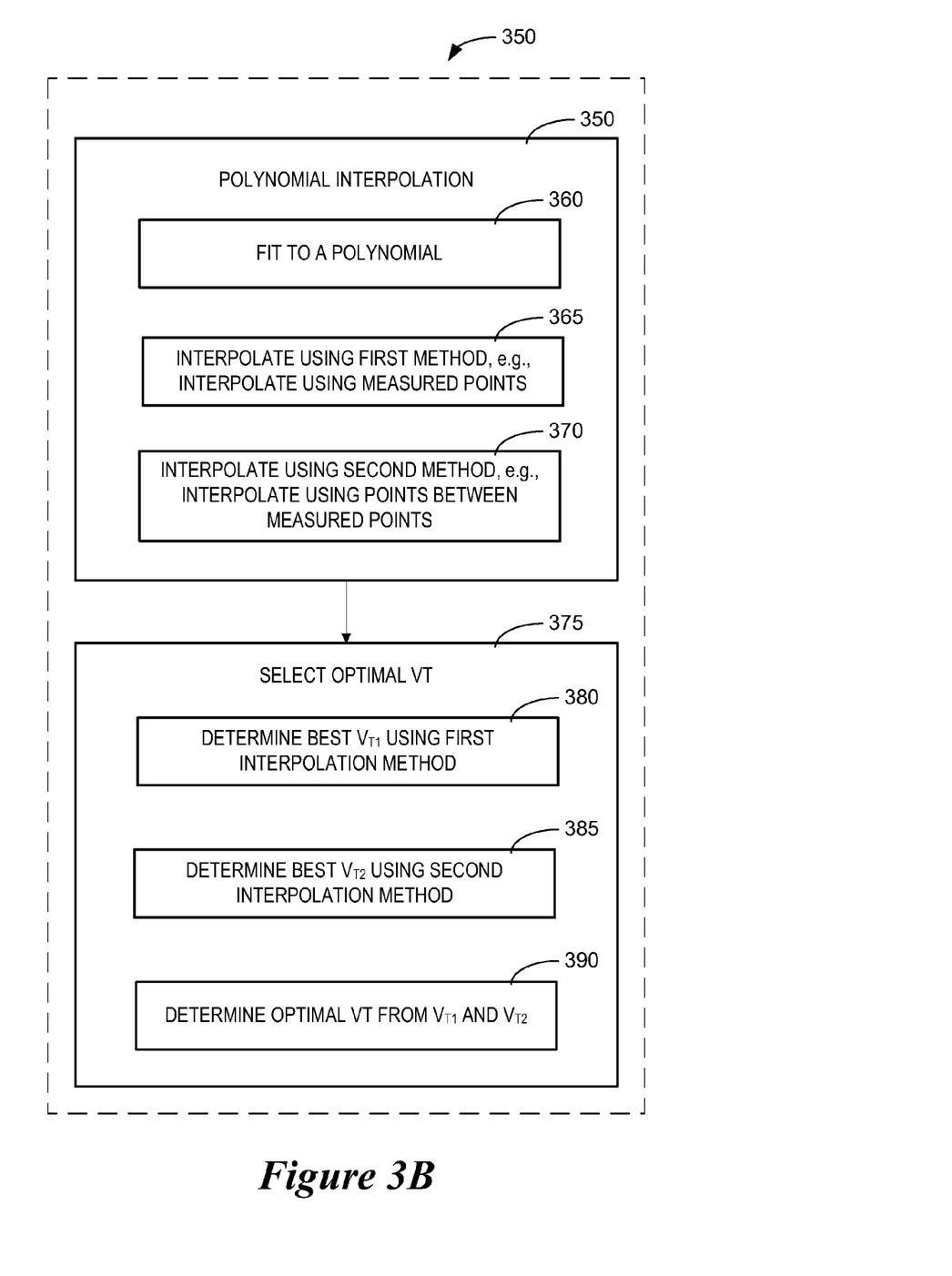
FIG. 3B provides a more expansive description of the select optimum VT step according to approaches described herein.

FIG. 3B provides a more expansive description of the minimum BER and optimum $V_T$ step 350 according to approaches described herein. A collection of data that has been shown to have a minimum BER meaningfully lower than the BER associated with the initial $V_T$ is passed to the polynomial interpretation step 355 data pack. Here the data is fit to a polynomial in step 360. The polynomial is a second order polynomial having one minimum as the data gathering was terminated. The polynomial can then be analyzed by one of two methods. The first method shown in step 365 involves just selecting the minimum BER from the measurements accumulated. The second method shown in step 370 involves selecting the minimum using points between the measurements. In this method a derivative is calculated for the polynomial and a minimum BER is determined where the change in $V_T$ is equal to zero. The process then proceeds to step 375 where the optimum $V_T$ is selected by one of two methods. One method can be used or both can be used and compared. The first method shown in step 380 involves observing the $V_T$ associated with the minimum BER measurement that was observed. The second method involves determining the $V_T$ associated with the calculated optimum BER by inserting the optimum BER into the polynomial equation and solving the equation for $V_T$, which is the optimum $V_T$. The process then proceeds to step 395 where the optimum $V_T$ determined by the first method and the second method are compared and the best value is determined to be the actual optimum $V_T$ that replaces the initial $V_T$. The first method generally requires more measurements that the second to achieve similar accuracy. Thus, some embodiments may only use the second method to determine the optimum $V_T$. However, in some situations, a comparison of the results of both methods using the same number of measurements is preferred. One such situation is when the inconsistency of step 345 comprises several measurements that are flat. In this situation, the first method would select the first flat point as the minimum BER while the second method would select a different BER between the last and second to last measurement, a less accurate value.

Figure 4:
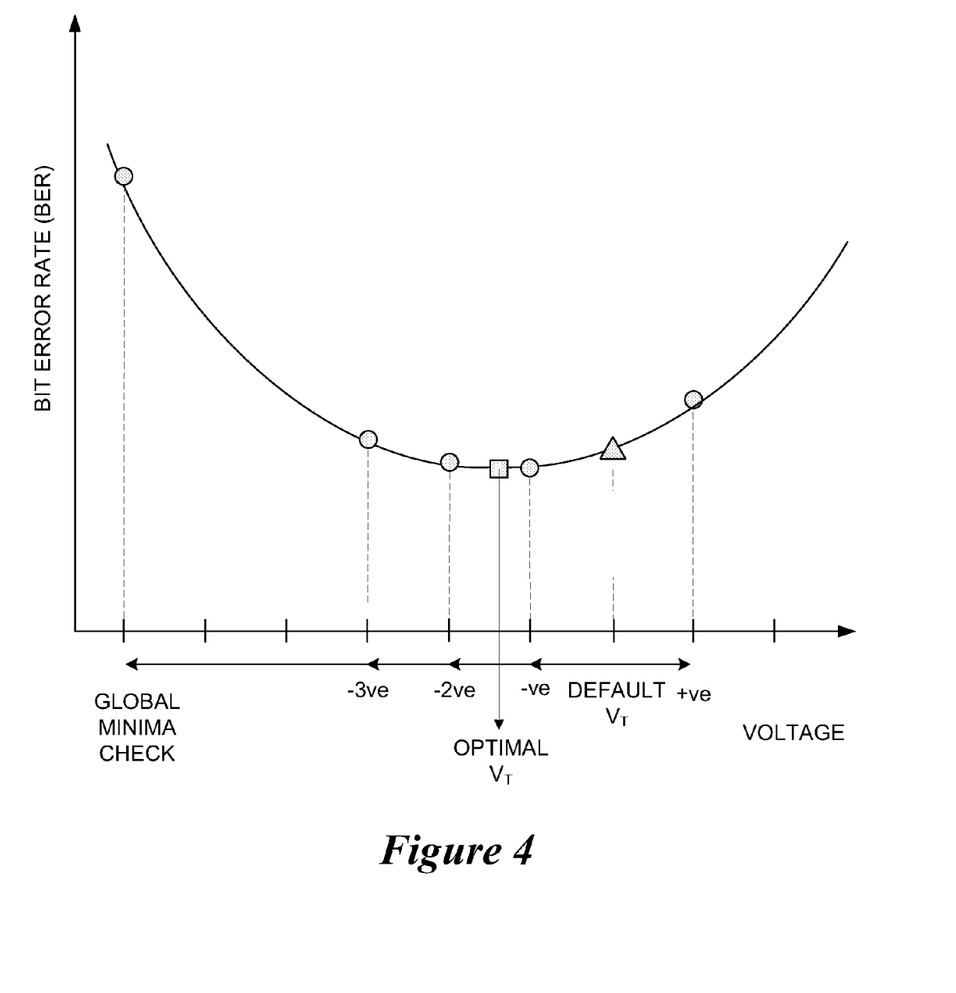
FIG. 4 shows a graph of an example of five threshold voltages related to an initial threshold voltage and the curve that fit this data according to the approach described herein.

FIG. 4 shows a graph of an example of five threshold voltages related to an initial threshold voltage and the curve that fit this data according to the approach described herein. As shown in this example of measurements, −ve was lower than the initial or default $V_T$ while +ve was higher. The first pair of measurements along the negative direction resulted in an inconsistency with the BER associated with −2ve being higher than that associated with −ve and the BER associated with −3ve being higher than that associated with −2ve. The first method shown in step 350 would result in an optimal $V_T$ of −ve. However, the second method would result in an optimal $V_T$ between −1ve and −2ve. In this example, the second result of the second method is best as the BER associated with that VT is lower than the one associated with −ve.

Figure 5:
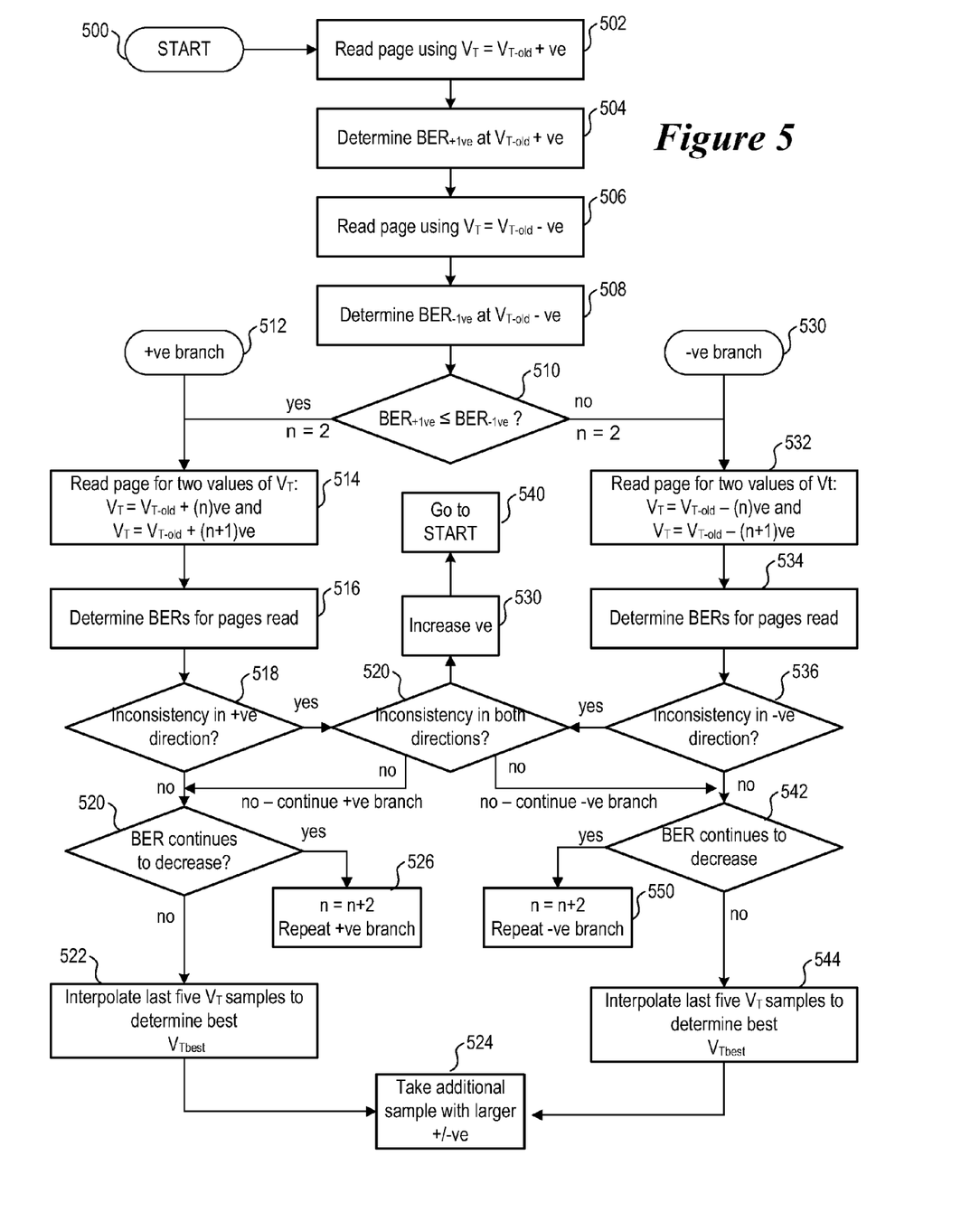
FIG. 5 shows a more detailed flow diagram describing the iterative process of determining a threshold voltage with a minimum bet error rate for reading data in accordance with example embodiments.

FIG. 5 shows a more detailed flow diagram describing the iterative process of determining a $V_T$ with a minimum BER for reading data in accordance with example embodiments. In this flow diagram analysis begins with +ve measurements. However, it is understood that the order of measurements of +ve or −ve is immaterial and the process measurement analysis may be reversed with the +ve in all steps being changed to −ve and vice versa. The analysis starts at step 500 with $V_{T-old}$ and its associated BER known. A reading is made of a page of memory using $V_T = V_{T-old}$+ve shown in step 502 and a determination of the BER at $V_{T-old}$+ve shown in step 504. Then the page is read using $V_T = V_{T-old}$−ve shown in step 506 and a determination of the BER at $V_{T-old}$−ve shown in step 508. Next, both BERs are compared in step 510. If $BER_{+ve} \leq BER_{-ve}$ then the analysis proceeds down the +ve branch of step 512 and two more measurements are taken at +2ve and +3ve, see step 514. Respective BERs are determined as shown in step 516, and inconsistencies are observed in step 518. As mentioned earlier, measurements are inconsistent when they are the same or higher than the initial unshifted measurement. Measurements are consistent when they are lower than the initial unshifted measurement. If inconsistencies are not observed, the analysis proceeds to step 520 where a decision is made whether the BER continues to decrease or not. If it does not, then analysis passes to step 522 where interpolation is made of the last number of samples (e.g., last five samples) to determine the optimum $V_T$, the $V_{T-best}$. These samples may include the data for $V_{T-old}$ if five measurements have not been made. An additional sample is taken with a larger ve shift, as shown in step 524, to determine whether the effect is local or global for the digital entry region. In some embodiments, step 524 is performed before the best fit is determined in step 522 to result in a better polynomial fit to the measured data and the last six samples, including that for $V_{T\text{-}old}$, are used to determine best fit. In step 520, if the BER does continue to decrease, "n" is increased by 2 in step 526 and the analysis proceeds to step 512 to gather additional measurements along the positive direction.

If inconsistency is observed in the positive direction in step 518 then the analysis proceeds to step 520 where both directions are analyzed for inconsistency. Then, if only one direction has been analyzed at this point, steps 530 to 534 conduct the same analysis for −ve as steps 512 to 518 did for the positive branch. If both directions show inconsistencies, then the analysis proceeds to step 538 where the shift size is increased and the step 540 directs the analysis to begin again at step 500. As discussed above, the increase in ve has a predetermined limit. When the limit is reached, the analysis terminates rather than repeating and the default $V_{T\text{-}old}$ is unchanged.

If inconsistencies are not observed in the negative −ve direction in step 536, then the analysis proceeds down steps 542, 544 and 524, or 542, 550 and 530 in a manner similar to that discussed for the +ve from step 520 to step 522 to step 524, or step 520 to step 526 to step 512.

The above analysis is for each $V_T$. However, a memory cell may have both an unchanged $V_T$ and an optimized $V_T$. A $V_T$ exists for each pair of digital entry values. Thus, an SLC having only one pair of "1" and "0" for each memory cell has one $V_T$. However, it is possible to have more than one $V_T$ in a memory cell. MLCs have more than one $V_T$, each associated with a pair of individual digital entry values. Thus, an MLC may have at least one initial $V_T$ that was unchanged and at least one optimum $V_T$ that was changed.

The memory controller embodiment for operating a memory device to determine an optimum $V_T$ comprises a memory interface, a decoder, and a voltage analyzer. The memory interface is configured to receive data from a solid-state, non-volatile memory, the data read using $V_T$ shifted by each of at least three voltage steps. The decoder is configured to decode the received data and to determine respective BERs of cells of the memory for each of the shifted $V_T$ values. The $V_T$ analyzer is configured to perform at least three tasks. First, it applies a polynomial fit to the respective BERs as a function of the shifted $V_T$ values. Second, it determines an optimal BER having an associated optimal $V_T$ in response to the polynomial fit. Third, it sends the optimal $V_T$ for use in reading the data to the memory via the memory interface.

This embodiment has been discussed previously. The memory controller has been discussed above in FIGS. 1A and 1B. The three tasks that the $V_T$ analyzer is configured to perform has been disclosed in the discussion of FIGS. 2, 3A, 3B, 4, and 5.

The device embodiment involves a device comprising a solid-state, non-volatile memory, read circuitry, a decoder, and a voltage threshold analyzer. The solid-state, non-volatile memory comprises an array of memory cells. The read circuitry is configured to read data from the memory cells using $V_T$ values, including reading data using shifted $V_T$ values comprising an initial $V_T$ shifted by each of at least three voltage steps. The decoder is configured to decode the data and to determine respective BERs of the memory cells for each of the shifted $V_T$ values. The $V_T$ analyzer is configured to perform at least three tasks. First, a polynomial fit is applied to the respective BERs as a function of the shifted $V_T$ values. Second, an optimal BER having an associated optimal $V_T$ is determined in response to the polynomial fit. Third, the optimal $V_T$ is sent to the read circuitry, wherein the read circuitry is configured to read data from the memory cells using the optimal $V_T$.

This embodiment has been discussed previously. The device has been discussed above in general and in FIGS. 1A and 1B in particular. The three tasks that the $V_T$ analyzer is configured to perform has been disclosed in the discussion of FIGS. 2, 3A, 3B, 4, and 5.

The foregoing description of the example embodiments have been presented for the purposes of illustration and description. It is not intended to be exhaustive or to limit the inventive concepts to the precise form disclosed. Many modifications and variations are possible in light of the above teachings. Any or all features of the disclosed embodiments can be applied individually or in any combination, not meant to be limiting but purely illustrative. It is intended that the scope be limited by the claims appended herein and not with the detailed description.

What is claimed is:

1. A method of operating a memory device, comprising:
   determining respective bit error rates affecting memory cells of a solid-state, non-volatile memory for shifted threshold voltages used to read the data values in the memory cells, the shifted threshold voltages comprising an initial threshold voltage shifted by each of at least three voltage steps;
   applying a polynomial fit to the respective bit error rates as a function of the at least three voltage steps;
   determining, in response to the polynomial fit, an optimal bit error rate having an associated optimal threshold voltage; and
   applying the optimal threshold voltage to read the data values in the cells.

2. The method of claim 1, wherein a first of the at least three voltage shifts is negative with respect to an initial threshold voltage of the cells, and wherein a second of the at least three voltage shifts is positive with respect to the initial threshold voltage.

3. The method of claim 2, wherein a direction of a third of the at least three voltage shift is chosen in response to the respective bit error rates of the first and second voltage shifts.

4. The method of claim 3, wherein additional pairs of voltage shifts are chosen in the same direction as the third voltage shift, the respective bit error rate for each is determined, and the polynomial fit is applied when a lower bit error rated is observed that is below the bit error rate of the initial threshold voltage and followed by a threshold voltage having a bit error rate that is not lower than the observed lower rate.

5. The method of claim 4, wherein an outlying threshold voltage shift extending in the same direction and beyond the furthest voltage shift of claim 4 is chosen, the associated bit error rate is determined and compared with the optimal bit error to determine if the optimal bit error rate is a global minimum or a local minimum.

6. The method of claim 5 wherein the optimal threshold voltage associated with the optimum bit error rate is applied to read the data values in the cells if the outlying bit error rate associated with the outlying threshold voltage is greater that the optimal bit error rate associated with the optimal threshold voltage.

7. The method of claim 1, wherein determining the respective bit error rates comprises of determining the respective bit error rates across a page of the memory cells.

8. The method of claim 1, wherein the memory cells of the solid-state, non-volatile memory are multi-level cells and the initial and optimal threshold voltages comprise an initial set and an optimal set of threshold voltages.

9. A memory controller, comprising:
a memory interface configured to receive data from a solid-state, non-volatile memory, the data read using threshold voltage shifted by each of at least three voltage steps;
a decoder configured to decode the received data and to determine respective bit error rates of cells of the memory for each of the shifted threshold voltages; and
a voltage threshold analyzer configured to:
apply a polynomial fit to the respective bit error rates as a function of the shifted threshold voltages;
determine, in response to the polynomial fit, an optimal bit error rate having an associated optimal threshold voltage; and
send to the memory via the memory interface the optimal threshold voltage for use in reading the data.

10. The memory controller of claim 9, wherein a first of the at least three voltage shifts is negative with respect to an initial threshold voltage of the cells, and wherein a second of the at least three voltage shifts is positive with respect to the initial threshold voltage.

11. The memory controller of claim 10, wherein a direction of a third of the at least three voltage shift is chosen in response to the respective bit error rates of the first and second voltage shifts.

12. The memory controller of claim 11, wherein additional pairs of voltage shifts are chosen in the same direction as the third voltage shift, the respective bit error rate for each is determined, and the polynomial fit is applied when a lower bit error rated is observed that is below the bit error rate of the initial threshold voltage and followed by a threshold voltage having a bit error rate that is not lower than the observed lower rate.

13. The memory controller of claim 12, wherein an outlying threshold voltage shift extending in the same direction and beyond the furthest voltage shift of claim 12 is chosen, the associated bit error rate is determined and compared with the optimal bit error to determine if the optimal bit error rate is a global minimum or a local minimum.

14. The memory controller of claim 13 wherein the optimal threshold voltage associated with the optimum bit error rate is applied to read the data values in the cells if the outlying bit error rate associated with the outlying threshold voltage is greater that the optimal bit error rate associated with the optimal threshold voltage.

15. A device, comprising:
a solid-state, non-volatile memory comprising an array of memory cells;
read circuitry configured to read data from the memory cells using threshold voltages, including reading data using shifted threshold voltages comprising an initial threshold voltage shifted by each of at least three voltage steps;
a decoder configured to decode the data and to determine respective bit error rates of the memory cells for each of the shifted threshold voltages; and
a voltage threshold analyzer configured to:
apply a polynomial fit to the respective bit error rates as a function of the shifted threshold voltages;
determine, in response to the polynomial fit, an optimal bit error rate having an associated optimal threshold voltage; and
send to the read circuitry the optimal threshold voltage, wherein the read circuitry is configured to read data from the memory cells using the optimal threshold voltage.

16. The device of claim 15, wherein a first of the at least three voltage shifts is negative with respect to an initial threshold voltage of the cells, and wherein a second of the at least three voltage shifts is positive with respect to the initial threshold voltage.

17. The device of claim 16, wherein a direction of a third of the at least three voltage shift is chosen in response to the respective bit error rates of the first and second voltage shifts.

18. The device of claim 17, wherein additional pairs of voltage shifts are chosen in the same direction as the third voltage shift, the respective bit error rate for each is determined, and the polynomial fit is applied when a lower bit error rated is observed that is below the bit error rate of the initial threshold voltage and followed by a threshold voltage having a bit error rate that is not lower than the observed lower rate.

19. The device of claim 18, wherein an outlying threshold voltage shift extending in the same direction and beyond the furthest voltage shift of claim 18 is chosen, the associated bit error rate is determined and compared with the optimal bit error to determine if the optimal bit error rate is a global minimum or a local minimum.

20. The device of claim 19 wherein the optimal threshold voltage associated with the optimum bit error rate is applied to read the data values in the cells if the outlying bit error rate associated with the outlying threshold voltage is greater that the optimal bit error rate associated with the optimal threshold voltage.

* * * * *